United States Patent
Brown et al.

(10) Patent No.: US 11,682,567 B2
(45) Date of Patent: Jun. 20, 2023

(54) CLEANING SYSTEM WITH IN-LINE SPM PROCESSING

(71) Applicant: Applied Materials, Inc., Santa Clara, CA (US)

(72) Inventors: Brian J. Brown, Palo Alto, CA (US); Ekaterina A. Mikhaylichenko, San Jose, CA (US); Brian K. Kirkpatrick, Allen, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/346,116

(22) Filed: Jun. 11, 2021

(65) Prior Publication Data

US 2021/0407825 A1 Dec. 30, 2021

Related U.S. Application Data

(60) Provisional application No. 63/046,571, filed on Jun. 30, 2020.

(51) Int. Cl.
*H01L 21/67* (2006.01)
*B08B 3/08* (2006.01)
*B08B 1/00* (2006.01)
*B08B 3/12* (2006.01)
(Continued)

(52) U.S. Cl.
CPC ........ *H01L 21/67057* (2013.01); *B08B 1/002* (2013.01); *B08B 1/04* (2013.01);
(Continued)

(58) Field of Classification Search
CPC ......... H01L 21/67057; H01L 21/67051; H01L 21/68707; H01L 21/02074;
(Continued)

(56) References Cited

U.S. PATENT DOCUMENTS 5,158,616 A    10/1992  Kinoshita et al.
6,461,441 B1 *  10/2002  Epshteyn .......... H01L 21/67046
                                                       134/32
(Continued)

FOREIGN PATENT DOCUMENTS

JP    H07-176507    7/1995
JP    2020-031181   2/2020
(Continued)

OTHER PUBLICATIONS

International Search Report and Written Opinion in International Appln. No. PCT/US2021/039692, dated Nov. 4, 2021, 9 pages.
(Continued)

*Primary Examiner* — Erin F Bergner
(74) *Attorney, Agent, or Firm* — Fish & Richardson P.C.

(57) ABSTRACT

A cleaning system for processing a substrate after polishing includes a sulfuric peroxide mix (SPM) module, at least two cleaning elements, and a plurality of robots. The SPM module includes a sulfuric peroxide mix (SPM) cleaner having a first container to hold a sulfuric peroxide mix liquid and five to twenty first supports to hold five to twenty substrates in the liquid in the first container, and a rinsing station having a second container to hold a rinsing liquid and five to twenty second supports to hold five to twenty substrates in the liquid in the second container. Each of the at least two cleaning elements are configured to process a single substrate at a time. Examples of a cleaning element include a megasonic cleaner, a rotating brush cleaner, a buff pad cleaner, a jet spray cleaner, a chemical spin cleaner, a spin drier, and a marangoni drier.

12 Claims, 7 Drawing Sheets

(51) Int. Cl.
*H01L 21/687* (2006.01)
*B08B 1/04* (2006.01)
*B08B 13/00* (2006.01)
*B08B 7/04* (2006.01)
*B65G 47/90* (2006.01)
*B08B 3/02* (2006.01)
*B08B 3/04* (2006.01)
*B08B 3/14* (2006.01)
*H01L 21/02* (2006.01)

(52) U.S. Cl.
CPC ............ *B08B 3/02* (2013.01); *B08B 3/022* (2013.01); *B08B 3/041* (2013.01); *B08B 3/08* (2013.01); *B08B 3/12* (2013.01); *B08B 3/14* (2013.01); *B08B 7/04* (2013.01); *B08B 13/00* (2013.01); *B65G 47/90* (2013.01); *H01L 21/67051* (2013.01); *H01L 21/68707* (2013.01); *B08B 2203/007* (2013.01); *H01L 21/02074* (2013.01)

(58) Field of Classification Search
CPC ........... H01L 21/67046; H01L 21/6708; H01L 21/67086; H01L 21/67751; H01L 21/67028; B08B 1/002; B08B 1/04; B08B 3/02; B08B 3/022; B08B 3/041; B08B 3/08; B08B 3/12; B08B 3/14; B08B 7/04; B08B 13/00; B08B 2203/007; B65G 47/90
See application file for complete search history.

(56) References Cited

U.S. PATENT DOCUMENTS

| | | |
|---|---|---|
| 2002/0164929 A1 | 11/2002 | Pinson, III et al. |
| 2004/0129678 A1 | 7/2004 | Crowley et al. |
| 2006/0201532 A1 | 9/2006 | Shirazi |
| 2006/0213538 A1* | 9/2006 | Umezawa .............. H01L 22/12 134/113 |
| 2008/0156359 A1 | 7/2008 | Olgado et al. |
| 2008/0251108 A1 | 10/2008 | Nagai et al. |
| 2009/0270015 A1 | 10/2009 | D'Ambra et al. |
| 2015/0013732 A1* | 1/2015 | Negoro .............. H01L 21/6708 134/102.1 |
| 2015/0332940 A1* | 11/2015 | Wang .............. H01L 21/67781 134/25.1 |
| 2020/0126831 A1* | 4/2020 | Feng .............. H01L 21/67754 |
| 2021/0407824 A1 | 12/2021 | Brown et al. |

FOREIGN PATENT DOCUMENTS

| | | |
|---|---|---|
| KR | 10-0637401 | 10/2006 |
| WO | WO 2019/047140 | 3/2019 |

OTHER PUBLICATIONS

Office Action in Indian Appln. No. 202347003559, dated Apr. 6, 2023, 4 pages (with English translation).

* cited by examiner

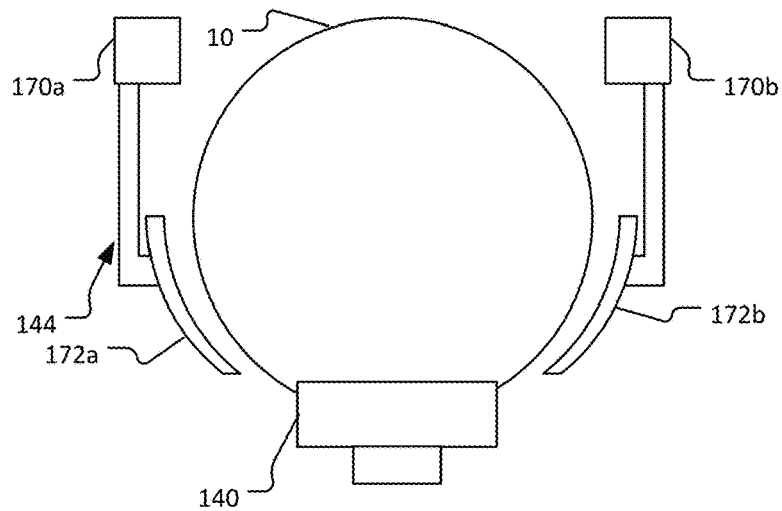
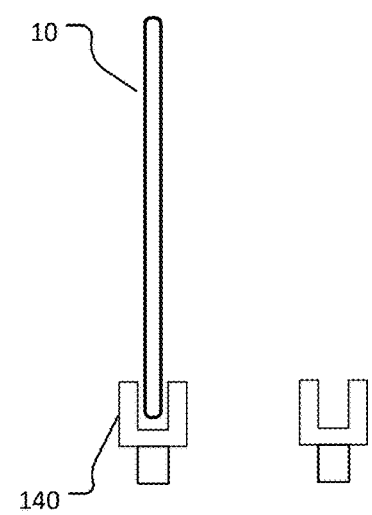
FIG. 6A  FIG. 6B
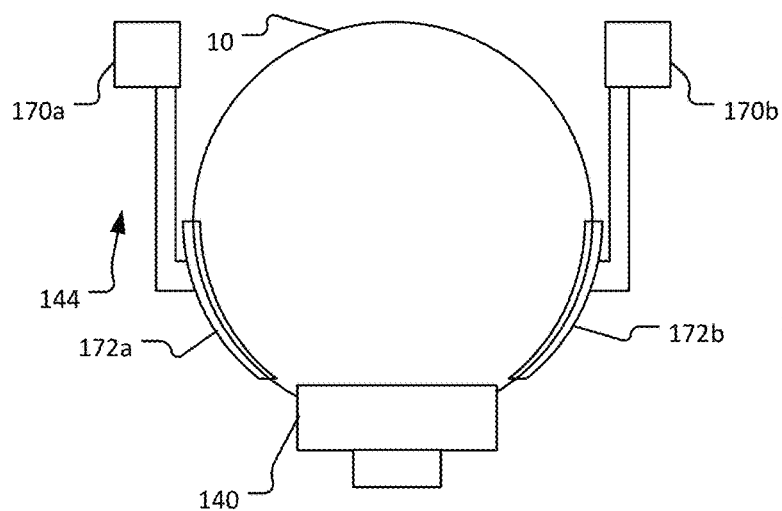
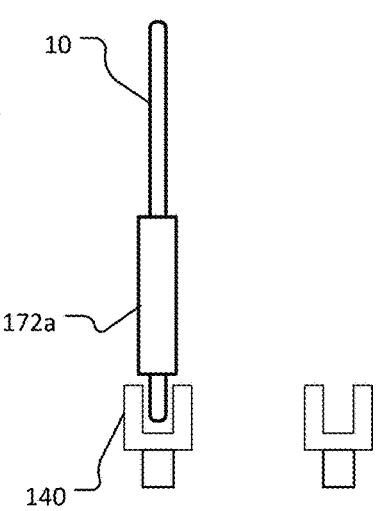
FIG. 6C  FIG. 6D
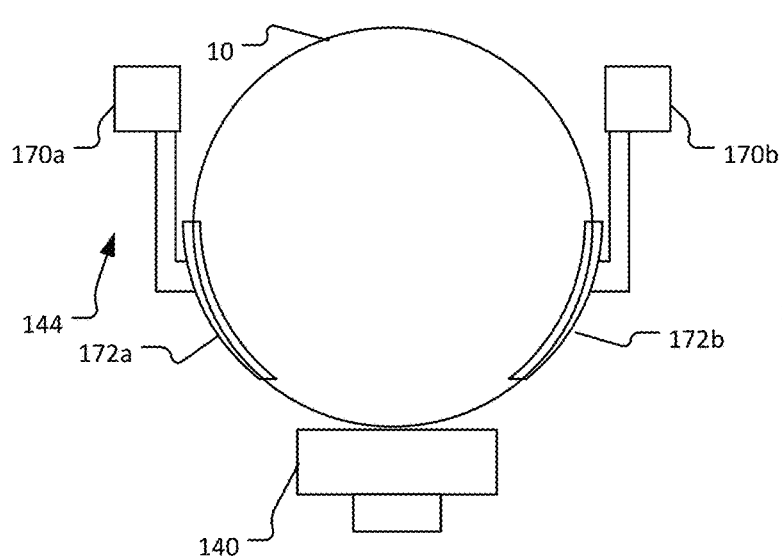
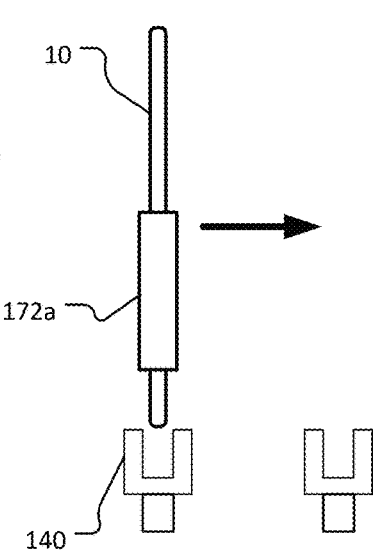
FIG. 6E  FIG. 6F

CLEANING SYSTEM WITH IN-LINE SPM PROCESSING

CROSS-REFERENCE TO RELATED APPLICATIONS

This application claims priority to U.S. Application Ser. No. 63/046,571, filed on Jun. 30, 2020, the disclosure of which is incorporated by reference.

TECHNICAL FIELD

The present disclosure relates to the in-line post-polish cleaning of substrates.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad. For example, cerium oxide can be used as an abrasive particle in the polishing of copper filler layers in CMP.

The slurry of abrasive particles can include cerium oxide particulates and organic additives, and can include other carbon-based residues from the polishing process. To remove these particulates, the substrates can be subjected to a cleaning process that can include the use of harsh oxidizing solvents. For example, a mixture of sulfuric acid and hydrogen peroxide (SPM) can be used in the removal of cerium oxide particulates from the surfaces of a substrate after polishing. SPM cleaning can be performed in a parallel separated mode in which each substrate is placed in a bath in a separate container.

SUMMARY

In one aspect, a substrate cleaning system to remove particulates from multiple substrates includes a first container for applying a cleaning liquid to substrates, a second container for applying a rinsing liquid to substrates, and a robot system. The first container includes at least two openable and closable access ports in a top of the first container and a plurality of supports to hold the substrates at respective edges in the first container. The second container has a plurality of supports to hold the substrates at respective edges in the second container. The robot system transports substrates through the at least two openable and closable access ports in the top of the first container, and transports substrates through a top of the second container.

In another aspect, a cleaning system for processing a substrate after polishing includes a sulfuric peroxide mix (SPM) module, at least two cleaning elements, and a plurality of robots. The SPM module includes a sulfuric peroxide mix (SPM) cleaner having a first container to hold a sulfuric peroxide mix liquid and five to twenty first supports to hold five to twenty substrates in the liquid in the first container, and a rinsing station having a second container to hold a rinsing liquid and five to twenty second supports to hold five to twenty substrates in the liquid in the second container. The at least two cleaning elements are selected from the group consisting of a megasonic cleaner, a rotating brush cleaner, a buff pad cleaner, a jet spray cleaner, a chemical spin cleaner, a spin drier, and a marangoni drier, and each of the at least two cleaning elements are configured to process a single substrate at a time. The plurality of robots are configured to transport a substrate through a first of the at least two ports in the top of the first container onto a support in the first container, remove the substrate from the first container through a first or second of the at least two ports in the top of the first container, transport the substrate through a top of the second container onto a support in the second container, remove the substrate from the second container, transport the substrate to a first of the at least two cleaning elements, and transport the substrate to a second of the at least two cleaning elements.

In another aspect, a method for removing particulates from a plurality of substrates includes opening a first access port of a plurality of openable and closable access ports in a top of a first container holding a cleaning fluid bath, inserting a first substrate through the first access port and delivering the first substrate onto a support of a plurality of supports in the cleaning fluid bath, closing the first access port, opening a second access port of the plurality of openable and closable access ports in the top of the first container, inserting a second substrate through the second access port and delivering the substrate onto a second support of the plurality of supports in the cleaning fluid bath, closing the second access port, opening the first access port in the top of the first container, removing the first substrate through the first access port and delivering the first substrate into a rinsing station, closing the first access port, opening the second access port in the top of the first container, removing the second substrate through the second access port and delivering the second substrate into a rinsing station, and closing the second access port.

In another aspect, a method for removing particulates from a plurality of substrates includes opening a first access port of a plurality of openable and closable access ports in a top of a first container holding a cleaning fluid bath, inserting a first substrate through the first access port and delivering the first substrate onto a first position in the cleaning fluid bath, closing the first access port, transferring the first substrate from the first position to a second position in the cleaning fluid bath, opening a second access port of the plurality of openable and closable access ports in the top of the first container, removing the first substrate through the second access port and delivering the first substrate into a rinsing station, and closing the second access port.

Certain implementations can include, but are not limited to, one or more of the following possible advantages. An in-line SPM processing system can perform batch mode processing of a number of substrates. The SPM processing can be integrated to the CMP system, thereby eliminating the need to transport cassettes of substrates to a separate SPM system and reducing time spent moving the substrate, thus improving cycle time. The in-line SPM processing system can also recirculate and filter the solution within the processing container to reduce the amount of processing chemicals needed per substrate, lowering the cost per substrate. By operating in a first-in, first-out mode, the in-line SPM processing system, substrates can reside in the SPM bath for a longer period of time to ensure cleanliness without reducing the throughput of the overall system and reducing the footprint of the integrated CMP machine.

The details of one or more implementations are set forth in the accompanying drawings and the description below. Other aspects, features and advantages will be apparent from the description and drawings, and from the claims.

BRIEF DESCRIPTION OF DRAWINGS

FIG. 6A-F are schematic diagrams of a running beam system.

Like reference symbols in the various drawings indicate like elements.

DETAILED DESCRIPTION

SPM cleaning can be performed in a parallel separated mode in which each substrate is placed in a bath in a separate processing chamber. Although this permits parallel processing of multiple substrates, the use of separate containers can increase the use of the processing chemistry, e.g., the sulfuric acid and hydrogen peroxide. Further, the chemistry may not be reusable; new chemistry may be needed for each substrate. This chemistry can be a significant expense.

Moreover, the time required for SPM processing can be fairly large relative to the polishing time, e.g., by a factor of 10 or more. Thus, in order to match the throughput of the polishing system so that SPM process is not gating the throughput, a large number of substrates would need to be processed in parallel by SMP. However, including multiple SPM chambers with each chamber processing a single substrate might not be feasible, due to cost, available footprint in the clean room, or chemistry expense.

An approach that may address one or more of these issues is to have an SPM processing system in which multiple substrates are processed in the same tank.

Figure 1:
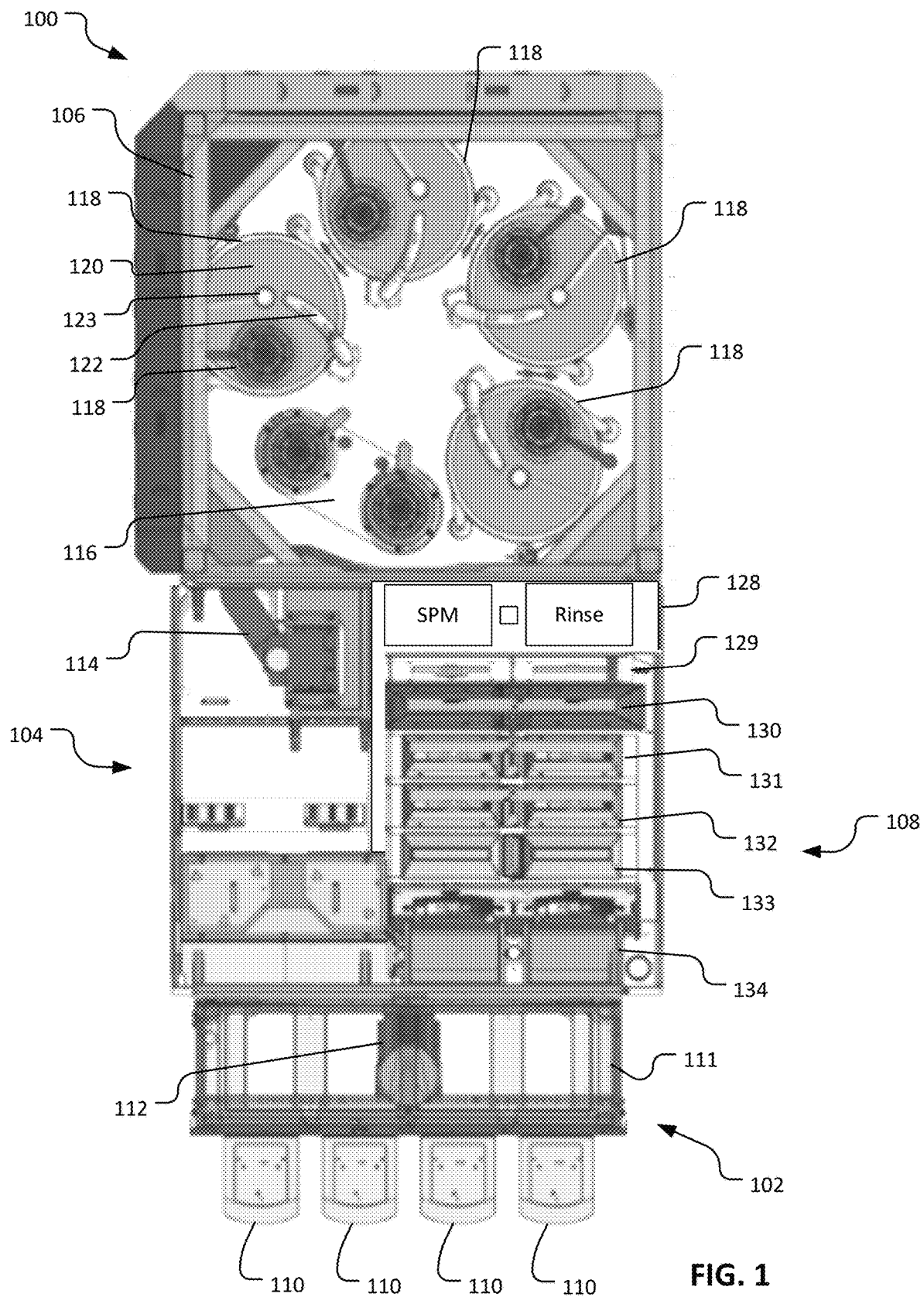
FIG. 1 is a schematic top view of a chemical mechanical polishing system.

FIG. 1 illustrates an interior view of a chemical mechanical polishing (CMP) system 100. The system 100 generally includes a factory interface module 102, input module 104, a polisher module 106, and a cleaning module 108. The four major components are generally disposed within the CMP system 100.

The factory interface 102 includes a support to hold plurality of substrate cassettes 110, a housing 111 that encloses a chamber, and one or more interface robots 112. The factory interface robot 112 generally provides the range of motion required to transfer substrates between the cassettes 110 and one or more of the other modules of the system 100.

Unprocessed substrates are generally transferred from the cassettes 110 to the input module 104 by the interface robot 112. The input module 104 generally facilitates transfer of the substrate between the interface robot 112 and the transfer robot 114. The transfer robot 114 transfers the substrate between the input module 104 and the polisher 102.

The polisher 106 generally comprises a transfer station 116, and one or more polishing stations 118. The transfer station 116 is disposed within the polishing module 106 and is configured to accept the substrate from the transfer robot 114. The transfer station 116 transfers the substrate to the carrier head 120 of a polishing station 118 that retains the substrate during polishing.

The polishing stations 118 includes a rotatable disk-shaped platen on which a polishing pad 120 is situated. The platen is operable to rotate about an axis. The polishing pad 120 can be a two-layer polishing pad with an outer polishing layer and a softer backing layer. The polishing stations 118 further includes a dispensing arm 122, to dispense a polishing liquid, e.g., an abrasive slurry, onto the polishing pad 120. In the abrasive slurry, the abrasive particles can be silicon oxide, but for some polishing processes use cerium oxide abrasive particles. The polishing station 118 can also include a conditioner head 123 to maintain the polishing pad 120 at a consistent surface roughness.

The polishing stations 118 include at least one carrier head 124. The carrier head 124 is operable to hold a substrate 10 against the polishing pad 110 during polishing operation. Following a polishing operation performed on a substrate, the carrier head 124 will transfer the substrate back to the transfer station 116.

The transfer robot 114 then removes the substrate from the polishing module 106 through an opening connecting the polishing module 106 with the remainder of the CMP system 100. The transfer robot 114 removes the substrate in a horizontal orientation from the polishing module 106 and reorients the substrate vertically to be placed in the cleaning module 108.

The cleaning module 108 generally includes one or more cleaning devices that can operate independently or in concert. For example, the cleaning module 108 can include, from top to bottom in FIG. 1, an SPM module 128 (described further below), an input module 129, one or more brush or buffing pad cleaners 131, 132, a megasonic cleaner 133, and a drier 134. Other possible cleaning devices include chemical spin cleaners and jet spray cleaners. A transport system, e.g., an overhead conveyor 130 that supports robot arms, can walk or run the substrates from device to device. Briefly, the one or more cleaners 131, 132 are devices in which a substrate can be placed and the surfaces of the substrate are contacted with rotating brushes or spinning buffing pads to remove any remaining particulates. The substrate is then transferred to the megasonic cleaner 133 in which high frequencies vibrations produce controlled cavitation in a cleaning liquid to clean a substrate. Alternatively, the megasonic cleaner can be positioned before the brush or buffing pad cleaners 131, 132. A final rinse can be performed in a rinsing module before being transferred to a drying module 134.

Although FIG. 1 illustrates the SPM module 128 as the first cleaning device in the sequence, this is not necessary for actual physical position or order of cleaning operations (although having the cleaning devices in same physical order as the order of operations will be more efficient for throughput). For example, the substrate could be processed by a brush or buffing pad cleaner (e.g., a buff pad), then by the SPM module, then by another brush or buffing pad cleaner (e.g., a rotating brush), and then by a jet spray cleaner.

As described above, the CMP system 100 transfers the substrates from the polishing module 106 into the cleaning module 108. Debris from the polishing process, e.g., abrasive particles or organic materials from the polishing pad or slurry, can be stuck to the substrates. Some of these materials, e.g., cerium oxide particulates, and organic additives from the polishing module 106, are difficult to remove with the cleaners 131, 132, 133 listed above. Therefore, the substrates are moved to an in-line sulfuric peroxide mixture (SPM) module 128 within the cleaning module 108. The SPM module shown in FIG. 1 is a module that allows for the in-line SPM cleaning of a number of substrates concurrently. The SPM module 128 includes two containers, a cleaning container 124 and a rinse container 126.

Figure 2:
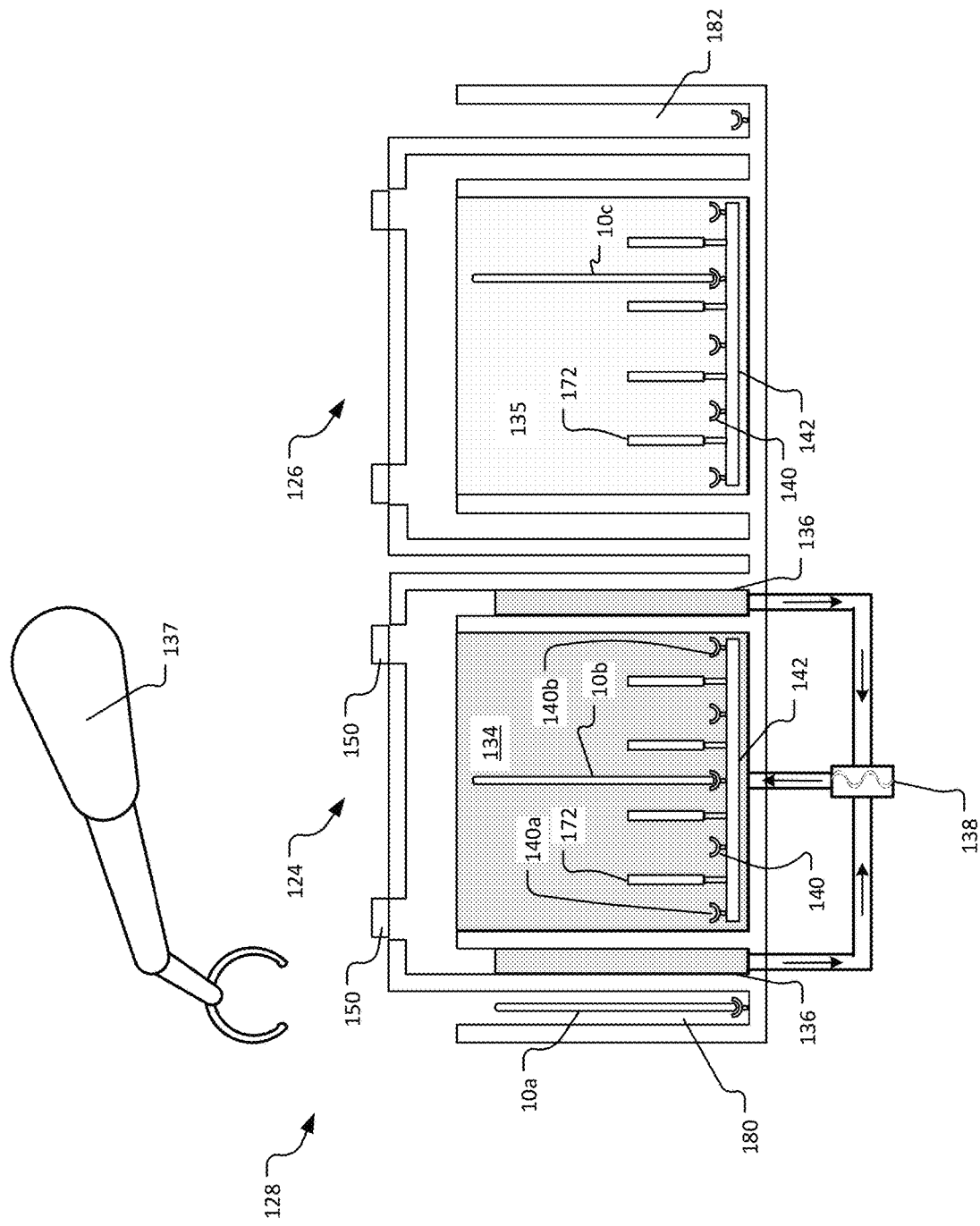
FIG. 2 is a schematic cross-sectional side view of an in-line sulfuric peroxide mixture cleaning tank.

A cutaway side-view of an SPM module 128 is shown in FIG. 2. The SPM module 128 includes a cleaning container 124, a rinse container 126, and a robot system of one or more dedicated robot arms 137 to transfer the substrates within the SPM module 128. The housing of the SPM module 128 can generally be made from any material suitable (e.g., not reactive) to be used with a mixture of sulfuric acid and peroxide. FIG. 2 shows the cleaning container 124 and rinse container 126 as positioned adjacent and connected at the base though, in general, the containers can be disposed anywhere within the CMP system 100 in any manner that befits the process.

Depicted on the left of the cleaning container 124 is a receiving station 180 where the transfer robot 114 places a substrate 10a to be cleaned. A robot arm of the cleaning module, e.g., a robot arm 137 of the SPM module 128, then grasps the substrate 10a and removes it from the receiving station 180.

Depicted on the right of the rinsing container 126 is an output station 182 where the transfer robot 114 places a substrate 10a that has been cleaned and rinsed. A robot arm of the cleaning module, e.g., the overhead conveyor, then grasps the substrate 10a and removes it from the output station 182.

Positioned at the top surface of each of the cleaning container 124 and rinse container 126 are a plurality of operable access ports 150. The access ports 150 can be closed to reduce the escape of fumes and liquid from the tanks, which can improve cleanliness and reduce operator risk. Generally, each container has at least two operable access ports 150; however, in some embodiments, the rinse tank may have an open top, e.g., no cover between the retracted position of the robot arm 137 and the liquid in the tank. FIG. 2 depicts two operable access ports 150 above each container but in general, there can be more than two. In some implementations, the plurality of access ports 150 in each container can be up to 40 ports. The access ports 150 can be operated by an independent or integrated controller to open or close the access ports 150 in response a command from the robot system. The access ports 150 of each container can be operated in unison or they can be operated independently. An example of an access port 150 is a slit valve.

The cleaning container 124 and rinse container 126 include interior compartments capable of holding liquids. The cleaning container 124 is filled with a cleaning liquid 134, e.g., the sulfuric peroxide mixture. In some implementations, the cleaning liquid 134 can be a mixture including about three parts sulfuric acid to about one part hydrogen peroxide. Adjacent to the filled cleaning compartment is at least one overflow basin 136.

The basin 136 can be any volume that generally surrounds the interior compartment. When the cleaning liquid 134 is recirculated within the interior compartment, any cleaning liquid 134 that overflows from the interior compartment is captured in the overflow basins 136, directed to a filtering, heating and replenishing system 138, and returned to the interior compartment.

Upon receiving a signal from a system controller, e.g., when the substrate 10a is grasped by a robot arm 137, at least one access port 150 is opened. The robot arm 137 then inserts the substrate 10a through the opened port 150 and places the substrate 10a in a support 140.

Disposed along the base and spaced apart along the length of the cleaning container 124 and the rinse container 126 are substrate supports 140. Each support 140 can grip a substrate 10 along the edge and is capable of holding the substrate 10 stationary. In general, each container has at least one support. FIG. 2 depicts five supports in each of the cleaning container 124 and rinse container 126 but in general there can be up to forty supports 140. FIG. 2 further depicts a substrate 10b placed in a support 140.

The robot arm 137 is then retracted from the access port 150 and the port 150 closed. Positioned adjacent to the line of supports 140 is a walking beam system 142 for sequentially transporting substrates from one stationary support 140 to the next using substrate grippers 172. The walking beam system 142 of FIG. 2 is shown with four grippers 172 but in general can have one less than the number of supports 140. The rails of the walking beam substrate transport system extend along the length of the interior compartment, parallel with the supports 140. Further details of the walking beam 142 system are depicted in FIGS. 5A-5F.

When a substrate 10 has completed a cleaning time period within the cleaning container 124, e.g., has moved from an initial support 140a to a final support 140b, an operable access port 150 above the substrate 10 is then opened and the substrate 10 removed via the robot arm 137. The port 150 then closes and the robot arm transfers the substrate 10 to a position above the access ports 150 of the rinsing container 126. The controller system then determines where the substrate 10 can be placed within the rinsing container 126 and opens the associated port 150 above the support 140. The robot arm inserts the substrate 10a through the opened port 150 and places the substrate 10a in a support 140. The robot arm 137 is then retracted from the access port 150 and the port 150 closed.

The rinse container 126 includes an interior compartment filled with high temperature rinsing liquid 135. For example, the liquid 135 can be de-ionized water. The rinsing liquid 135 within the rinse container 126 is circulated during operation of the SPM module 128 to remove residual cleaning liquid 134 from the substrates when placed in the container 126. Any overflowing rinsing liquid 135 can be allowed to drain away from the container. Alternately, the substrates can be sprayed with rinsing liquid 135 in rinse container 126.

The rinsing container 126 can utilize any substrate 10 conveyance mechanism described herein, e.g., walking beam, running beam, or conveyor, to transport the substrate 10 for the duration of the rinsing time period.

Processing substrates in a batch mode, e.g., the SPM module 128 of FIG. 2, achieves benefits to efficiency and materials usage for a number of substrates. Performing the cleaning or rinsing in a first-in-first-out (FIFO) mode allows each substrate to be processed for a time directed by the controller in the SPM module, which can be longer than the time in other system modules, without impacting the overall throughput of the system 100.

Another implementation of the SPM module 128 is shown in FIGS. 3A-D. This implementation does not utilize an in-container substrate transportation system. That is, the implementation does not utilize a walking beam or running beam system for transportation of the substrates 10 within the containers. Instead, the robot arm(s) (not shown) transports the substrates 10 between stationary supports 140 within the cleaning 125 and rinse 126 containers. This implementation of the SPM module 128 also includes fewer functional parts within the cleaning container 124 and rinse container 126, preventing wear on operational parts within a highly caustic solution.

The cleaning 125 and rinse 126 containers of FIGS. 3A-3D are shown with stationary supports 140 disposed along the bottom of the containers and an equal number of operable access ports 150, i.e., one port 150 for each support 140, along the top surface equal to the number of supports 140.

Although FIGS. 3A-3D illustrate the access ports 150 operating in unison, there can be a separate actuator for each port so that the ports 150 can open and close independently. The former permits all of the ports to be driven by a common actuator, which can be lower cost. The later permits only the port 150 associated with the support 140 to which a substrate is being placed or from which a substrate is being removed to be opened, which can reduce the escape of fumes or liquid.

This implementation of the SPM module 128 can operate in a "pick-and-place" method, as the robot arm(s) perform the work of gripping an individual substrate, placing the substrate in a location designated by the controller, and then picking up the substrate from the same location. In particular, this implementation of the SPM module 128 can perform a FIFO method in which the first substrate placed into the cleaning container 124 is the first substrate removed from the cleaning container 124. However, this implementation of the SPM module 128 is capable of arbitrary timing; substrates can be removed in any order in order to provide controlled time of processing for each substrate.

Figure 3A:
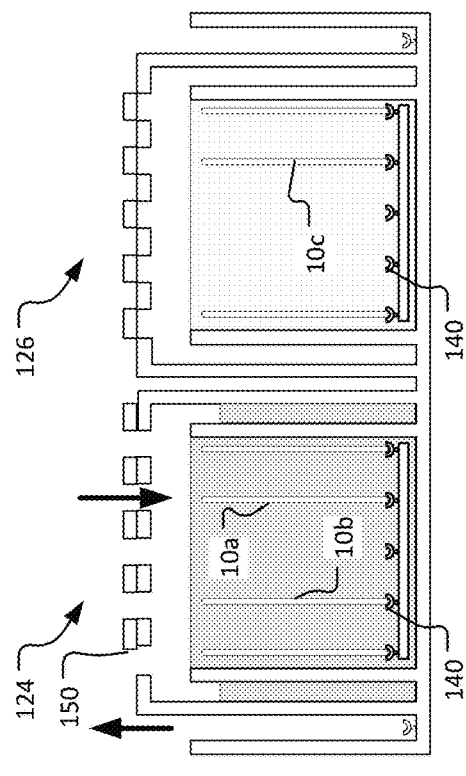
FIG. 3A-D are schematic diagrams of a pick-and-place FIFO method of substrate cleaning.

In FIG. 3A, an SPM module is depicted with three substrates 10a, 10b, and 10c. Substrate 10a is shown in the receiving station of the cleaning container 124 after being placed by the transfer robot 114. Substrate 10b is shown in the cleaning container 124. Substrate 10c is shown in the rinse container 126 after having completed a cleaning time period in the cleaning container 124.

Figure 3B:
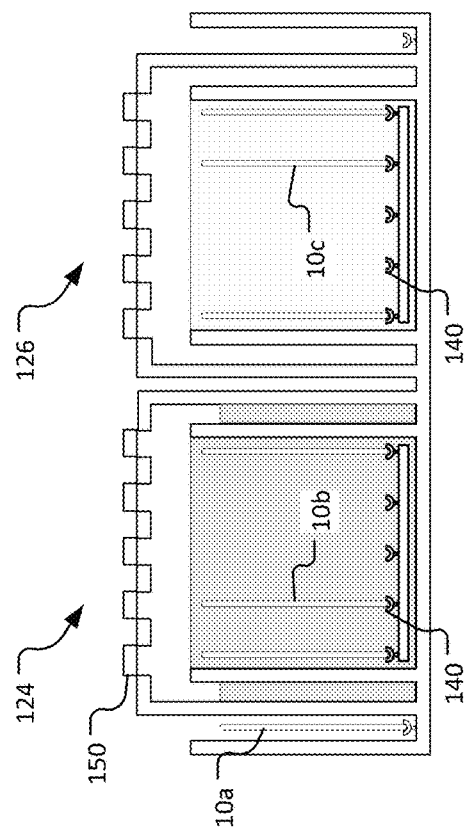

FIG. 3B depicts the first step in the stationary FIFO process. Substrate 10a is taken from the receiving station by the robot arm, the access ports 150 of the cleaning container 124 are opened, and substrate 10a placed in an empty support 140. The robot arm is then retracted from the access port 150 and the SPM controller notes a beginning time for the cleaning time period for substrate 10a.

The cleaning time period is generally any time determined to be sufficient for the removal or dissolution of particulates but in some implementations can be about 8 mins to about 12 mins (e.g., about 9 mins to about 11 mins, or about 10 mins).

Figure 3C:
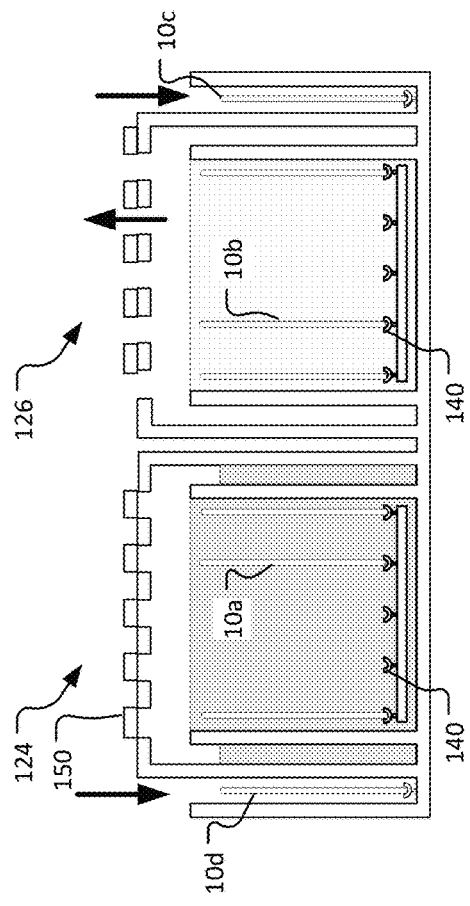

FIG. 3C depicts the end of the cleaning time period for substrate 10b. The access ports 150 for the cleaning container 124 are opened and the robot arm removes substrate 10b from the support 140 and retracts the robot arm through the access port 150. The controller system then opens the access port 150 in the rinsing container 126 corresponding with an empty support 140. Substrate 10b is inserted through the access port 150 and placed in a support 140. The robot arm then retracts through the port 150 and the controller notes a beginning time for the rinsing time period for substrate 10a.

The rinsing time period is generally any time determined to be sufficient for the dilution of residual SPM but in some implementations can be about 8 mins to about 12 mins (e.g., about 9 mins to about 11 mins, or about 10 mins).

Figure 3D:
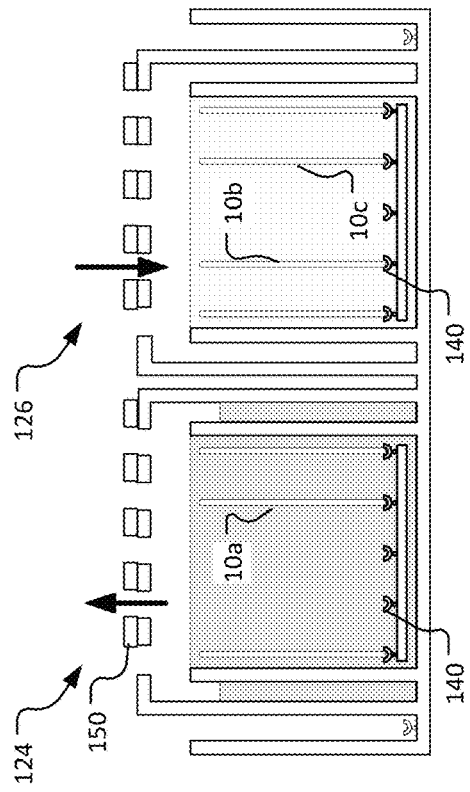

FIG. 3D depicts the end of the rinsing time period for substrate 10c. The access ports 150 for the rinsing container 124 are opened and the robot arm removes substrate 10c from the support 140 and retracts the robot arm through the access port 150. The robot arm then inserts a substrate 10c within the support of the output station on the right. The transfer robot of the SPM system can then remove substrate 10c from the SPM module.

An alternative FIFO method to that depicted in FIGS. 3A-3D is shown in FIGS. 4A-4D. The FIFO operating mode in FIGS. 4A-4D depict a method in which the substrates 10 are transported in a continuous or timed manner and can use the various in-container transport systems described herein, e.g., the walking beam system 142 of FIGS. 5A-5F, the running beam system 144 of FIG. 6A-6F, or the conveyor of FIG. 7, or another in-container transport system. Unlike the system shown in FIGS. 3A-3D, in which there is an access port 150 for each support, the configuration shown in FIGS. 4A-4D has just two access ports 150, a first of which is used for inserting the substrates and a second of which is used for removing the substrates.

Figure 4A:
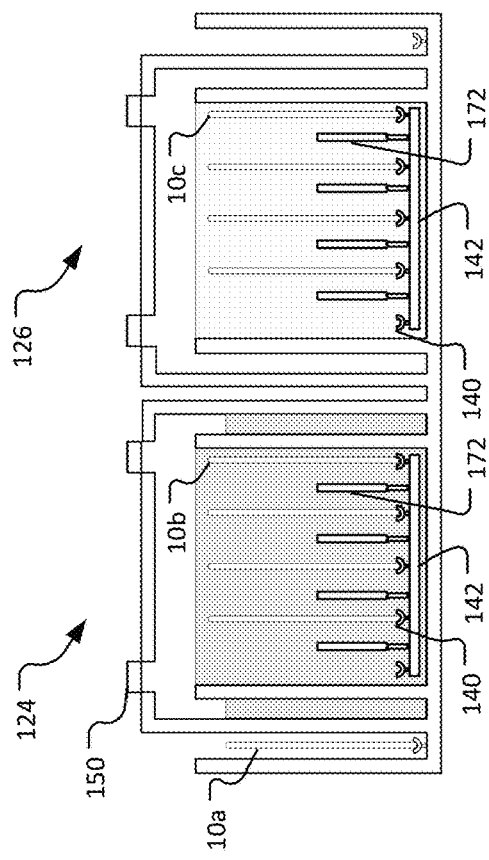
FIG. 4A-D are schematic diagrams of a continuous FIFO method of substrate cleaning.

In FIG. 4A, an SPM module is depicted with a number of substrates 10, including exemplary substrates 10a, 10b, and 10c. Substrate 10a is shown in the receiving station of the cleaning container 124 after being placed by the transfer robot 114. Substrate 10b is shown in the cleaning container 124. Substrate 10c is shown in the rinse container 126 after having completed a cleaning time period in the cleaning container 124.

Upon placement of substrate 10a in the receiving station of the SPM module 100, the controller then directs the walking beam 142 to transport the plurality of substrates within the cleaning container 124 forward by a distance. The distance can be a fraction of the total length of the cleaning container 124. Generally, the distance between the first and the last openable access port 150 can be divided by the number of supports to determine the distance needed to travel per substrate disposed or removed from the cleaning container 124.

Figure 4B:
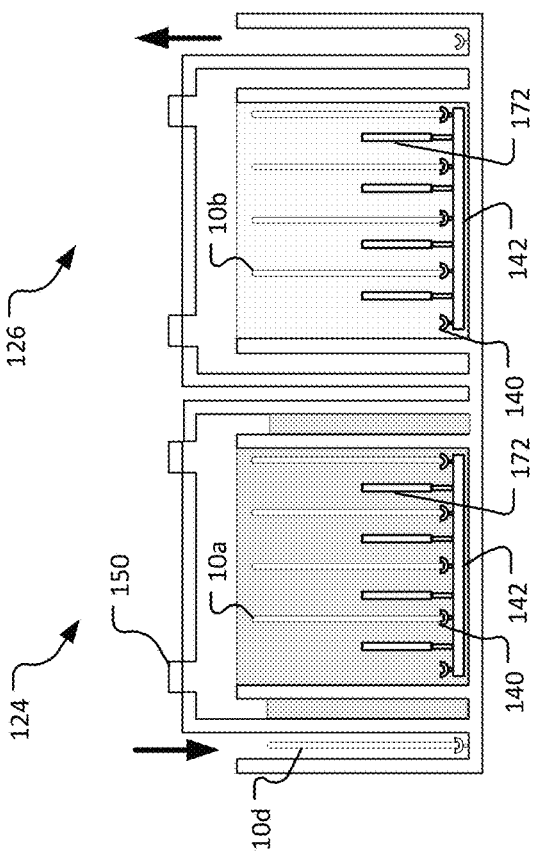
Figure 4C:
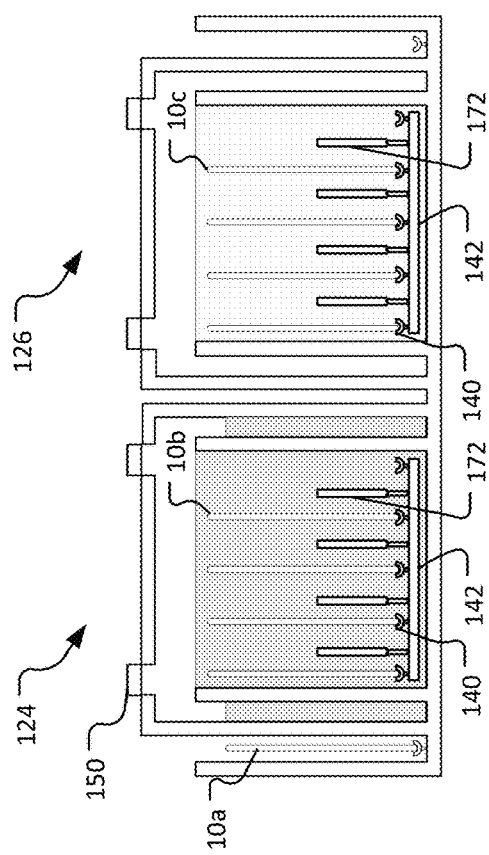

In FIG. 4B, the grippers 172 of the walking beam system 142 transport substrates 10b and 10c toward the last access port 150 on the top of the cleaning container 124 and rinse container 126. FIG. 4B depicts a walking beam 142 system along the bottom of containers 124 and 126 but in general, the substrates can be moved by any transportation mechanism described herein, e.g., running beam, walking beam, or conveyor.

When the cleaning time period for substrates 10b and 10c have completed and they are positioned beneath the last access port in the cleaning container 124 and rinse container 126, access ports 150 are opened by the controller. The robot arm (not shown) then removes substrate 10b from the cleaning container 124 and inserts it through the first open access port of the rinsing container 126. Substrate 10b is placed in the first support 140 and the robot arm withdrawn from the first access port of the rinsing container 126.

The robot arm then removes substrate 10c from the rinsing container 126 and places substrate 10c in the output station.

Substrate 10a is removed from the receiving station by the robot arm and inserts it through the first open access port of the cleaning container 126. Substrate 10a is placed in the first support 140 and the robot arm withdrawn from the first access port of the cleaning container 126.

Figure 4D:
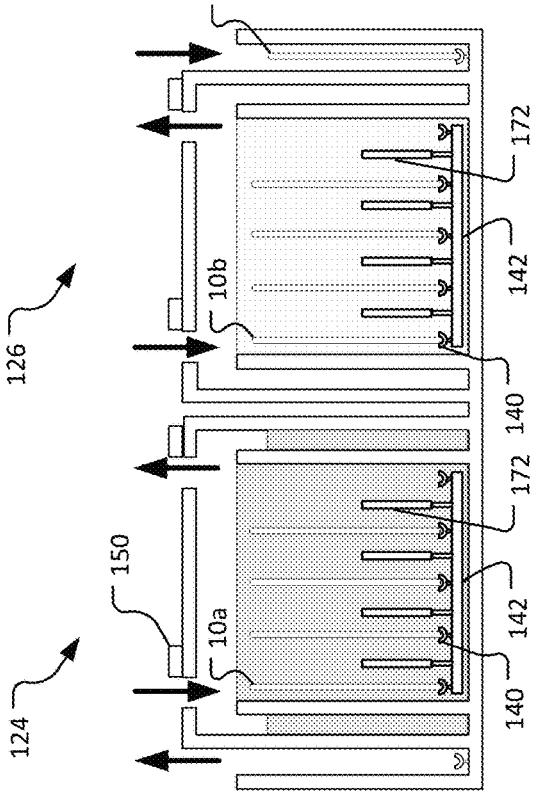

As shown in FIG. 4D, the transfer robot of the CMP system can then place another substrate 10d in the receiving station of the SPM module and retrieve substrate 10c from the terminal station to be moved to the next module of the CMP system.

Figure 5A:
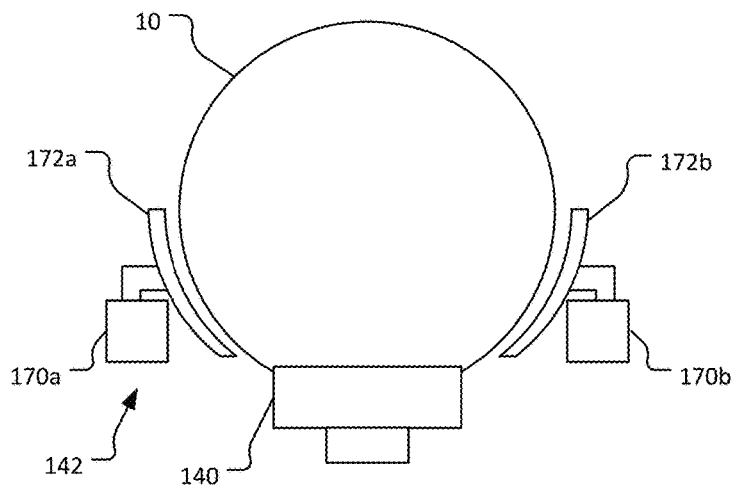
FIG. 5A-F are schematic diagrams of a walking beam system.
Figure 5B:
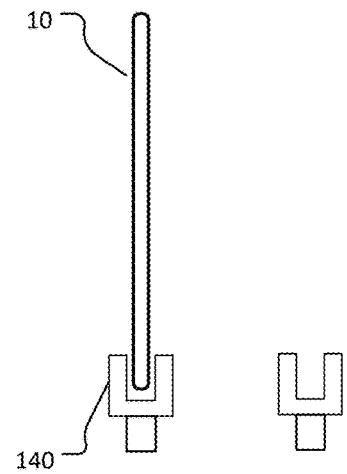

FIGS. 5A-5F are schematic diagrams depicting the walking beam system 142 and the operation thereof. As shown in FIG. 5A, a substrate 10 is positioned vertically in a support 140 within a cleaning container 124 or rinse container 126. FIG. 5B shows an edge view from the left of FIG. 5A of the substrate 10 in the support 140. The walking beam is not shown for clarity. Referring again to FIG. 5A, adjacent the substrate 10 on opposing sides are two walking beam rails 170a and 170b. Coupled to each walking beam rail, 170a and 170b, is a gripping device, 172a and 172b, respectively. The gripping devices 172 can be arranged to be opposite one another and in line with the substrate 10.

Figure 5C:
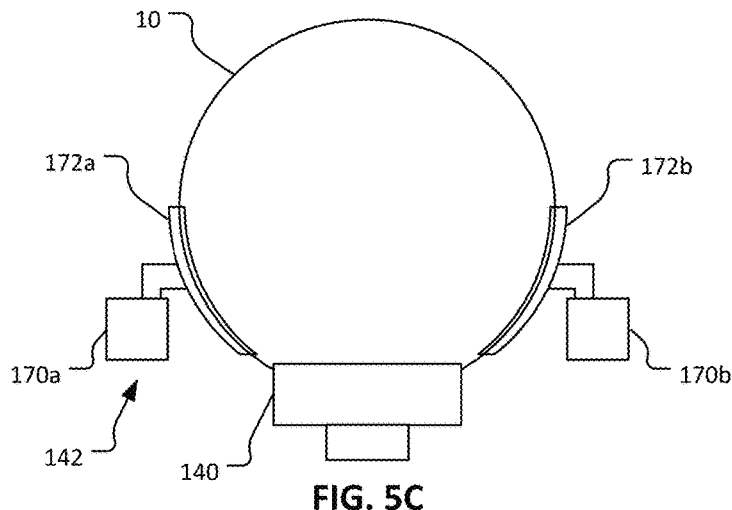
Figure 5D:
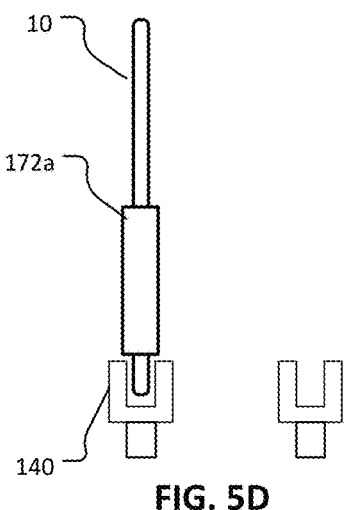

Upon a signal from a controller, as shown in FIG. 5C, the grippers 172a and 172b can be actuated to move toward the substrate 10, thereby contacting the edge on opposing sides. FIG. 5D shows the edge view of the substrate 10 in the support 140 being contacted with the left gripper 172a.

Figure 5E:
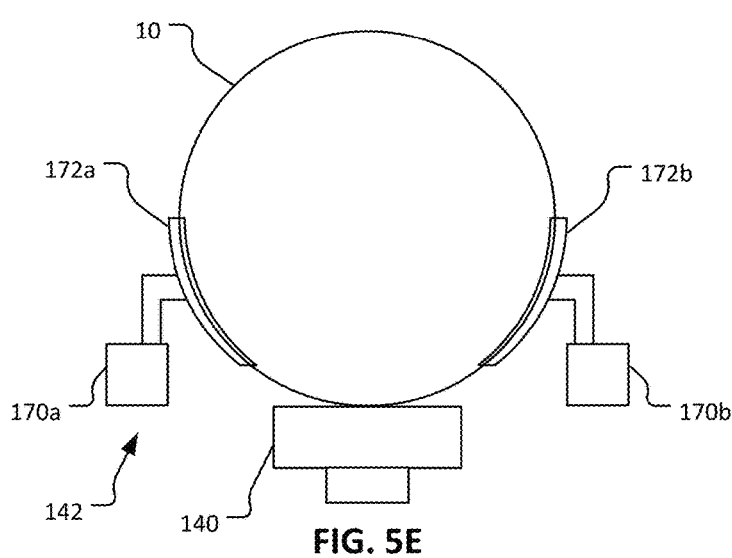
Figure 5F:
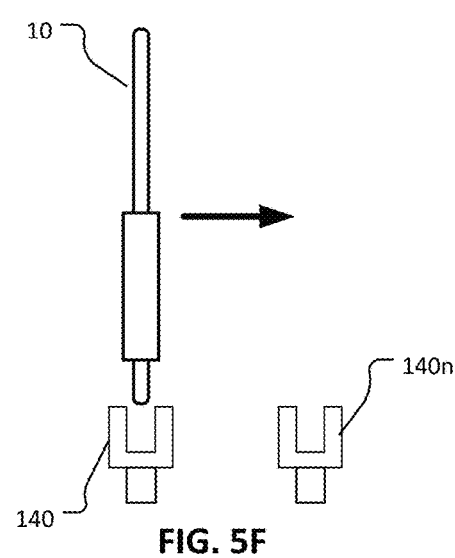

As shown in FIG. 5E, the walking beam system 142 then raises the grippers 172, thereby lifting the substrate 10 from the support 140 to a height at which the bottom edge of the substrate 10 is above the upper edge of the support 140. Alternatively, the support(s) 140 could be lowered so that the substrate is placed into the grippers 172. The grippers 172 then move axially along the walking beams 170 to transfer the substrate 10 to the next ordinal support 140n, as shown in FIG. 5F. When operating within the cleaning container 124 and the rinse container 126 the walking beam grippers 172 operate in concert to transfer the substrates 10 in the containers simultaneously to the next ordinal support 140.

As an alternative to a walking beam system 142, FIGS. 6A-6F depict details of a running beam system 144 which the cleaning container 124 and rinse container 126 of the SPM system 128 can use to control the movements of the substrates 10. FIG. 6A depicts a running beam system 144 wherein the rails 170 extend longitudinally along the top of the container. The grippers 172 extend downward from the rails 170, aligning along opposite edges of the substrate 10. FIG. 6B shows an edge view from the left of FIG. 6A of the substrate 10 in the support 140. The running beam is not shown for clarity. Referring again to FIG. 6A, the running beam system 142 includes the same components as the walking beam 140 system, including rails 170 and gripping devices 172.

Upon a signal from a controller, as shown in FIG. 6C, the grippers 172a and 172b can be actuated to move toward the substrate 10 thereby contacting the edge on opposing sides. FIG. 6D shows the edge view of the substrate 10 in the support 140 being contacted with the left gripper 172a.

As shown in FIG. 6E, the grippers 172 retract upward after gripping the substrate 10, thereby lifting the substrate 10 from the support 140 to a height at which the bottom edge of the substrate 10 is above the upper edge of the support 140. The grippers 172 then move axially along the running beams 170 to transfer the substrate 10 to the next ordinal support, as shown in FIG. 6F. Whereas the walking beam system 142 moves the totality of substrates 10 in a cleaning container 124 or rinse container 126 simultaneously, the running beam system 144 moves the substrates individually. The running beam system 144 moves the substrate 10 nearest the exit of the cleaning container 124 or rinse container 126 to the next ordinal support 140, and works to move consecutive substrates 10 toward the exit of the container.

As an alternative to the walking 142 and running beam 144 systems shown in FIGS. 5A-5F and FIGS. 6A-6F, FIG. 7 depicts a conveyor system 700 which can be used to move the substrates 10 through the cleaning container 124 and rinse container 126 of the SPM module 128. The conveyor 700 includes a plurality of supports 140 affixed to a continuous belt 710. In general, the belt 710 can have at least one support 140. In some implementations, the backing 710 can includes up to 80 supports 140.

Figure 7:
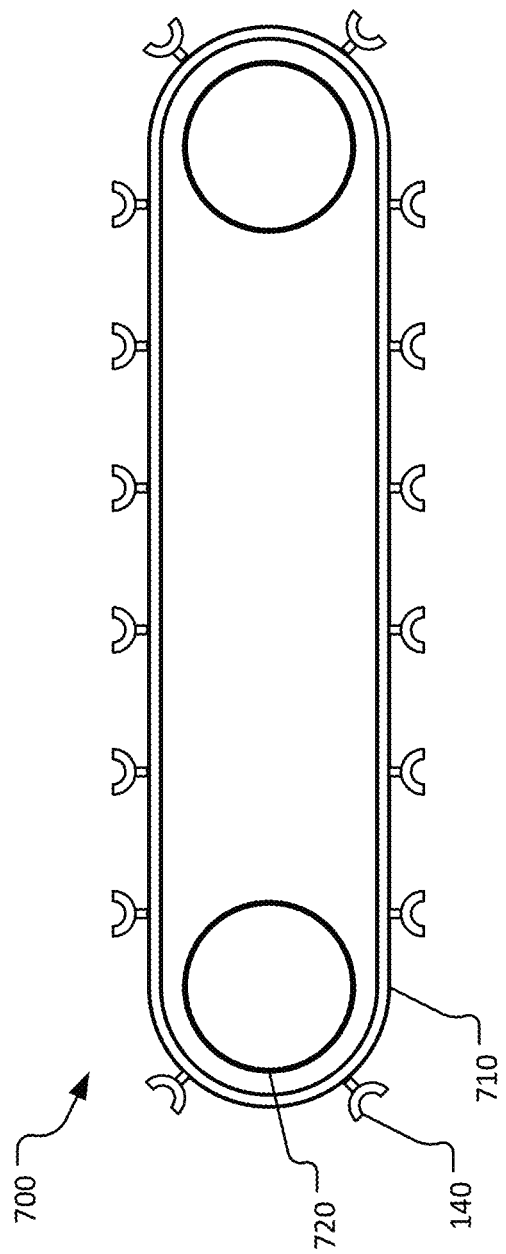
FIG. 7 is a schematic diagram a conveyor system.

The conveyor system 700 also includes a drive mechanism 720, e.g., two drive wheels, in contact with the inner surface of the belt 710. FIG. 7 depicts two drive wheels but in general, there can be as many as necessary to carry the number of supports required within the cleaning container 124 and rinse container 126. The drive mechanisms 720 can be controlled via the local SPM controller, or the CMP controller. The drive mechanisms 720 can be operable within the containers 124 and 126, or they can be operable externally from the containers, e.g., a magnetic drive system.

In general, the supports on the conveyor can be uniformly spaced along the outer surface of the backing 710. The number of supports 140 on the backing 710 can be such that there is a number of supports on the upper surface of the backing 710 equal to the number of substrates being processed in containers 124 and 126. The drive mechanism 720 can transport the substrates held in the backing 710 continuously or intermittently. A drive mechanism 720 operating intermittently operates such that the robot arm 137 retrieves and places substrates 10 into the supports 140 while the drive mechanism 720 is not operating, e.g., static. The transportation rate of the drive mechanism 720 can be such that a substrate placed in a support at the first access port reaches the last access port after a determined time period.

A number of embodiments of the invention have been described. Nevertheless, it will be understood that various modifications may be made without departing from the spirit and scope of the invention. Accordingly, other embodiments are within the scope of the following claims.

What is claimed is:

1. A cleaning system for processing a substrate after polishing, the system comprising:
   a sulfuric peroxide mix (SPM) module including
      a sulfuric peroxide mix (SPM) cleaner having a first container to hold a sulfuric peroxide mix liquid and five to twenty first supports to hold five to twenty substrates in the liquid in the first container, and
      a rinsing station having a second container to hold a rinsing liquid to remove the sulfuric peroxide mix liquid and five to twenty second supports to hold five to twenty substrates in the rinsing liquid in the second container;
   at least two cleaning elements selected from the group consisting of a megasonic cleaner, a rotating brush cleaner, a buff pad cleaner, a jet spray cleaner, a chemical spin cleaner, a spin drier, and a marangoni drier, each of the at least two cleaning elements configured to process a single substrate at a time; and a plurality of robots configured to transport a substrate through a first of at least two ports in a top of the first container onto a support of the five to twenty first supports in the first container, remove the substrate from the first container through a first or second of the at least two ports in the top of the first container, transport the substrate through a top of the second container onto a support of the five to twenty second supports in the second container, remove the substrate from the second container, transport the substrate to a first of the at least two cleaning elements, and transport the substrate to a second of the at least two cleaning elements.

2. The system of claim 1, comprising a substrate input station, and a controller configured to cause the plurality of robots to transport the substrate from the input station to the SPM module, from the SPM module to the first of the at least two cleaning elements, and from the first of the at least two cleaning elements to the second of the at least two cleaning elements.

3. The system of claim 1, comprising a substrate input station, and a controller configured to cause the plurality of robots to transport the substrate from the input station to the first of the at least two cleaning elements, transport the substrate from the first of the at least two cleaning elements to the SPM module, and from the SPM module the second of the at least two cleaning elements.

4. The system of claim 1, wherein the plurality of robots include a first robot having an arm movable along a first axis.

5. The system of claim 4, wherein the SPM module, the first of the at least two cleaning elements, and the second of the at least two cleaning elements are arranged in the aforementioned order along the first axis.

6. The system of claim 4, wherein the first of the at least two cleaning elements, the SPM module, and the second of the at least two cleaning elements are arranged in the aforementioned order along the first axis.

7. The system of claim 6, wherein the plurality of robots include a second robot to transport the substrate from an input station to the SPM module.

8. The system of claim 4, wherein the sulfuric peroxide mix (SPM) cleaner and the rinsing station are arranged side by side along a second axis perpendicular to the first axis.

9. The system of claim 8, wherein the plurality of robots include a second robot to transport the substrate from the SPM cleaner to the rinse station.

10. The system of claim 9, wherein the plurality of robots include a third robot to transport the substrate from a substrate input station to the SPM module.

11. The system of claim 1, wherein the least two cleaning elements include a rotating brush cleaner, a buff pad cleaner, and a jet spray cleaner.

12. A system for processing a substrate after polishing, the system comprising:
  a polisher including a rotatable platen to hold a polishing pad and a carrier head to hold the substrate against polishing pad;
  a transfer station to load and unload the substrate from the carrier head;
  a cleaner including
    a sulfuric peroxide mix (SPM) module including
      a receiving station,
      a sulfuric peroxide mix (SPM) cleaner having a first container to hold a sulfuric peroxide mix liquid and five to twenty first supports to hold five to twenty substrates in the liquid in the first container, and
      a rinsing station having a second container to hold a rinsing liquid to remove the sulfuric peroxide mix liquid and five to twenty second supports to hold five to twenty substrates in the rinsing liquid in the second container,
    at least two cleaning elements selected from the group consisting of a megasonic cleaner, a rotating brush cleaner, a buff pad cleaner, a jet spray cleaner, a chemical spin cleaner, a spin drier, and a marangoni drier, each of the at least two cleaning elements configured to process a single substrate at a time, and
    a plurality of robots configured to transport a substrate from the receiving station through a first of at least two ports in the top of the first container onto a support of the five to twenty first supports in the first container, remove the substrate from the first container through a first or second of the at least two ports in a top of the first container, transport the substrate through a top of the second container onto a support of the five to twenty second supports in the second container, remove the substrate from the second container, transport the substrate to a first of the at least two cleaning elements, and transport the substrate to a second of the at least two cleaning elements; and
  a transfer robot configured to transport a substrate from the transfer station directly to the receiving station.

* * * * *

UNITED STATES PATENT AND TRADEMARK OFFICE
CERTIFICATE OF CORRECTION

PATENT NO. : 11,682,567 B2
APPLICATION NO. : 17/346116
DATED : June 20, 2023
INVENTOR(S) : Brian J. Brown, Ekaterina A. Mikhaylichenko and Brian K. Kirkpatrick It is certified that error appears in the above-identified patent and that said Letters Patent is hereby corrected as shown below:

In the Claims

In Claim 11, Column 12, Line 1, after "the" insert -- at --.

In Claim 12, Column 12, Line 34, delete "the" and insert -- a --.

In Claim 12, Column 12, Line 38, delete "a" and insert -- the --.

Signed and Sealed this
Twenty-second Day of August, 2023

Katherine Kelly Vidal
*Director of the United States Patent and Trademark Office*